US008786266B2

(12) United States Patent
Deval et al.

(10) Patent No.: US 8,786,266 B2
(45) Date of Patent: Jul. 22, 2014

(54) EFFECTIVE CURRENT SENSING FOR HIGH VOLTAGE SWITCHING REGULATORS (75) Inventors: Philippe Deval, Lutry (CH); Philippe Gimmel, Lausanne (CH); Marius Budaes, Jud. Bacau (RO); Daniel Leonescu, Bucharest (RO); Terry Cleveland, Endicott, NY (US); Scott Dearborn, Brackney, PA (US)

(73) Assignee: Microchip Technology Incorporated, Chandler, AZ (US)

( * ) Notice: Subject to any disclaimer, the term of this patent is extended or adjusted under 35 U.S.C. 154(b) by 350 days.

(21) Appl. No.: 12/985,746

(22) Filed: Jan. 6, 2011

(65) Prior Publication Data
US 2011/0187340 A1 Aug. 4, 2011

Related U.S. Application Data (60) Provisional application No. 61/300,174, filed on Feb. 1, 2010.

(51) Int. Cl.
G05F 1/00 (2006.01)
(52) U.S. Cl.
USPC ............ 323/282; 323/285; 323/316; 327/543
(58) Field of Classification Search
USPC ................. 323/282, 284, 285, 316, 907–909; 327/543, 538, 530; 361/93.1, 93.9
See application file for complete search history.

(56) References Cited

U.S. PATENT DOCUMENTS

| 6,624,671 | B2 * | 9/2003 | Fotouhi .......................... 327/112 |
| 7,141,955 | B1 * | 11/2006 | Martinez ........................ 323/272 |
| 7,282,894 | B2 * | 10/2007 | Oswald et al. ................ 323/224 |
| 7,327,130 | B1 | 2/2008 | Giannopoulos et al. ....... 323/285 |
| 7,557,557 | B2 * | 7/2009 | Sugie et al. .................... 323/316 |
| 8,085,026 | B2 * | 12/2011 | Iliasevitch ..................... 323/285 |
| 8,098,059 | B2 * | 1/2012 | Nakahashi et al. ............ 323/282 |
| 2002/0158615 | A1 | 10/2002 | Goodfellow et al. .......... 323/315 |
| 2008/0130330 | A1 * | 6/2008 | Tao ................................. 363/74 |
| 2009/0160418 | A1 | 6/2009 | Kawagishi et al. ............ 323/311 |

OTHER PUBLICATIONS

International PCT Search Report and Written Opinion, PCT/US2011/022837, 10 pages, Mailed Oct. 6, 2011.

* cited by examiner

Primary Examiner — Nguyen Tran
(74) Attorney, Agent, or Firm — King & Spalding L.L.P.

(57) ABSTRACT

A high voltage switching regulator has significantly reduced current sensing delay between measurement of input current and generation of sensed current values, while maintaining good accuracy of the current through a power transistor using current replication and a current conveyor. High sensing accuracy of the input current ensures good load regulation, and low sensing delay ensures fixed duty cycle over a wide range of output currents and high input to output voltage ratios. A current conveyor is used to transfer high side current values to low side control circuits, e.g., pulse width modulation (PWM) control. The current conveyor is always on, e.g., some current flow is always present, thus minimizing any current measurement delay. This is accomplished by dynamically biasing the current conveyor by draining to ground a current equal to the sensed current. Wherein balancing of the current conveyor is ensured and offset at the input of the current conveyor is minimized.

17 Claims, 6 Drawing Sheets

FIGURE 1

FIGURE 2
(Prior Technology)

EFFECTIVE CURRENT SENSING FOR HIGH VOLTAGE SWITCHING REGULATORS

RELATED PATENT APPLICATION

This application claims priority to commonly owned U.S. Provisional Patent Application Ser. No. 61/300,174; filed Feb. 1, 2010; entitled "Effective Current Sensing for High Voltage Switching Regulators," by Philippe Deval, Philippe Gimmel, Marius Budaes, Daniel Leonescu, Terry Cleveland and Scott Dearborn; and is hereby incorporated by reference herein for all purposes.

TECHNICAL FIELD

The present disclosure relates to switching regulator power supplies, and more particularly, to high resolution current measurement with minimum measurement delay in a switching regulator power supply.

BACKGROUND

As higher efficiency for low power applications is sought, more and more linear regulator solutions are being replaced by switching regulator solutions. However, limitations of present technology switching regulators generally are limited to monitoring the VIN/VOUT ratio. When using current sensing to control the switching regulator power supply, significant delays may exist when measuring input current for generating values for sensed current especially when a high voltage regulator of the switched power supply is operating at very low duty cycles. Current sensing precision is critical in high performance, high voltage switching regulators.

Figure 1:
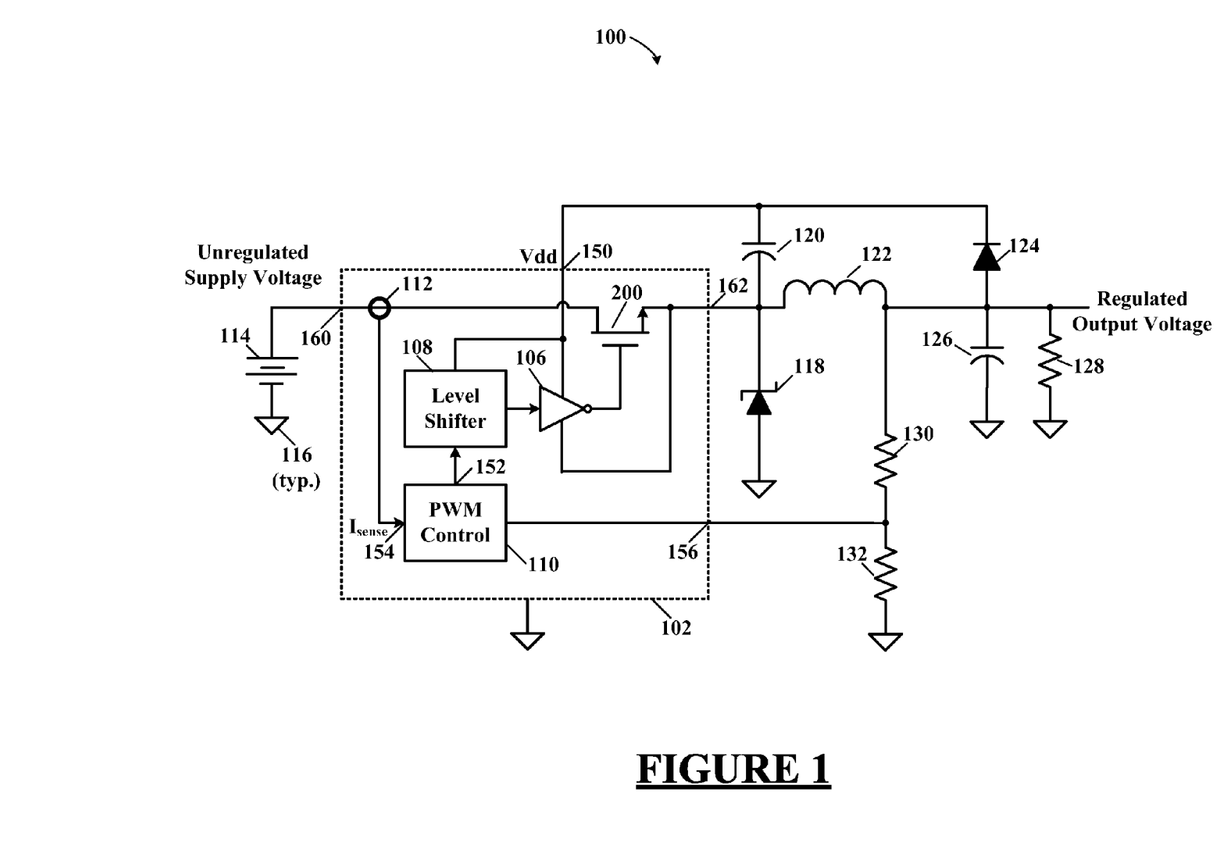
FIG. 1 illustrates a schematic diagram of a high voltage, non-synchronous, high-side drive switching regulator, according to the teachings of this disclosure.
Figure 2:
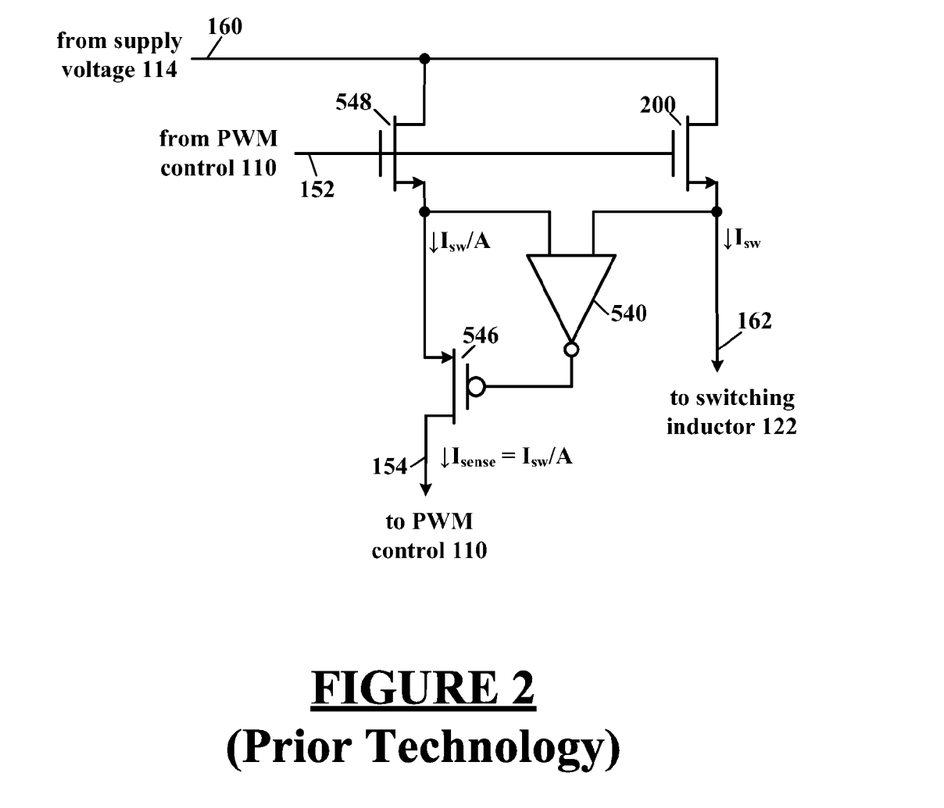
FIG. 2 illustrates a simplified schematic diagram of a prior technology switching power transistor and current sensing circuit.

Referring to FIG. 2, depicted is a simplified schematic diagram of a prior technology switching power transistor and current sensing circuit. This circuit has been used in high voltage, non-synchronous, high-side drive switching regulator circuits like the one shown in FIG. 1. The basic principle of current sensing is to measure the current flowing in a sensing transistor 548 that is biased under the same conditions as the power switching transistor 200. The measured current is weighted by an aspect ratio between the power switching transistor 200 and sensing transistor 548, usually in the range of from about 1/1000 to about 1/10,000. A current conveyor (540, 546) is used for forcing the voltage across the sensing transistor 548 to be equal to the voltage of the power switching transistor 200. During operation the voltage across the power switching transistor 200 varies a lot depending whether the power switching transistor 200 is "on" or "off," and the switching slopes are very fast (very high dv/dt). The current conveyor must follow the voltage on power switching transistor 200, that a significant loss of accuracy is induced as well as measured noise. Switching noise increases and accuracy decreases with the transfer ratio of the DC/DC converter.

SUMMARY

The aforementioned problems are solved, and other and further benefits achieved by reducing current sensing delay, e.g., significant delay reduction between measurement of input current and generation of sensed current values, while maintaining high accuracy in the measurement of current through a switching power transistor by using current replication (mirroring) and a current conveyor.

According to the teachings of this disclosure, a current sensing circuit detects with good measurement accuracy and reduced delay the value of a current passing through a high voltage power switching device. In the case of a sensor, two of the most important parameters are accuracy and speed. Fast response allows for better control of high speed devices, while accuracy ensures increased regulation resolution. This is also valid in the case of high voltage, peak current mode control buck regulators. Fast current sensing speed allows for high input to output voltage ratios and wide output current ranges, and the high measurement accuracy ensures stable cycle by cycle PWM pulse width that minimizes PWM control signal jitter.

This produces a high voltage switching regulator that has significantly reduced current sensing delay between measurement of input current and generation of sensed current values to the control circuits, while maintaining accuracy in the measurement of current through a power switching transistor using current replication and a current conveyor. High sensing accuracy of the input current ensures good load regulation, low sensing delay ensures a stable fixed duty cycle over a wide range of output currents and high input to output voltage ratios. A current conveyor is used to transfer high side current values to low side control circuits, e.g., pulse width modulation (PWM) control. The current conveyor is always on, e.g., some current flow is always present, thus minimizing any current measurement delay. This is accomplished by dynamically biasing the current conveyor. Wherein balancing of the current conveyor is ensured and offset at the input of the current conveyor is minimized.

Figure 3:
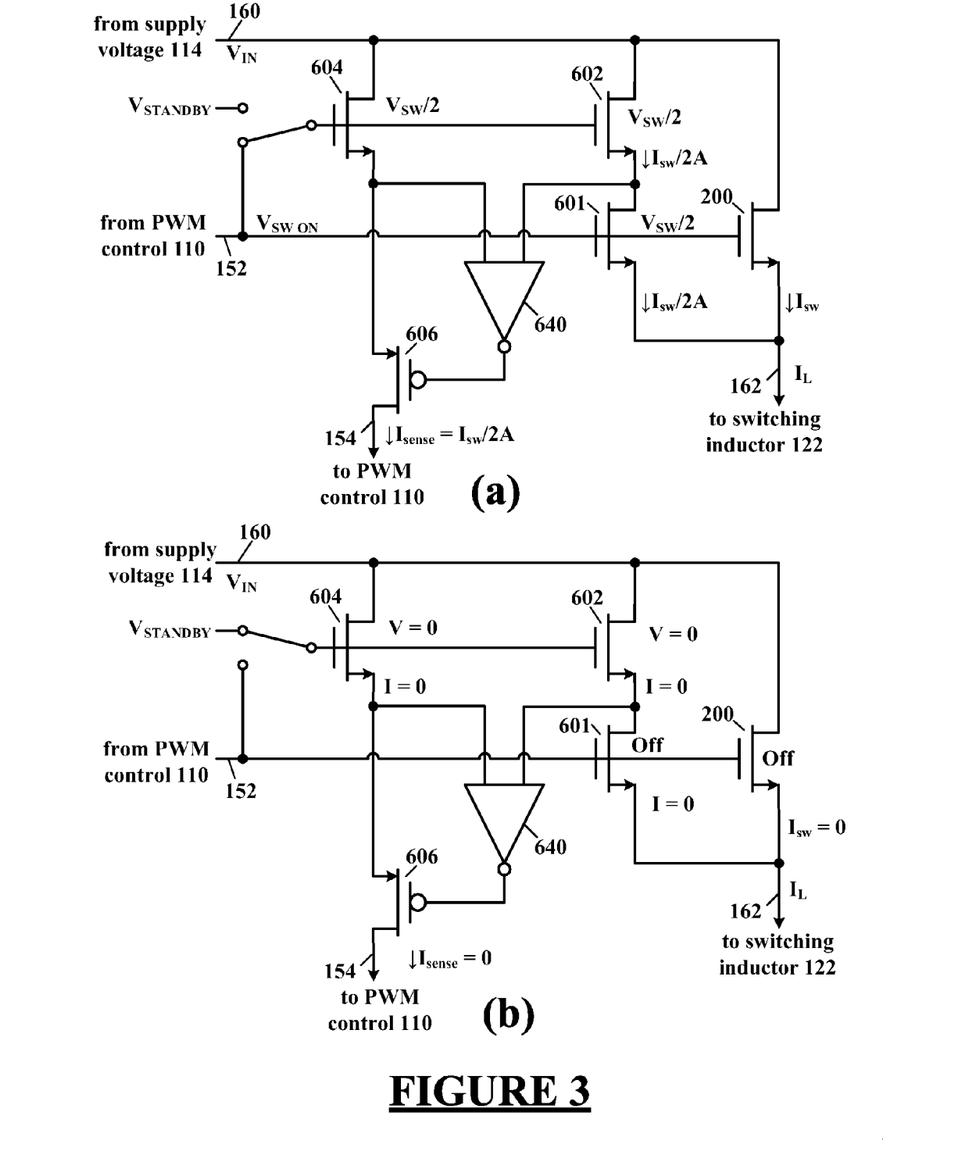
FIG. 3 illustrates simplified schematic diagrams of a switching power transistor and current conveyor showing on and off conditions for purposes of explanation, according to the teachings of this disclosure.

The principle of this invention is to force the voltage across the sensing transistor to be equal to the voltage of the power switching transistor during the "on" state only and force a zero voltage across the sensing transistor during the "off" state of the power switching transistor. Thus the voltage swing at the current conveyor input is dramatically reduced inducing a significant improvement of the accuracy as well as much reduced switching noise on the measured current. In practice this principle is difficult to apply directly. This is why a fraction only, typically half, of the voltage across the pass transistor during the "on" state will be used for sensing the current as illustrated in FIG. 3(a). Referring now to FIG. 3, depicted are simplified schematic diagrams of a switching power transistor and current conveyor showing on and off conditions for purposes of explanation, according to the teachings of this disclosure. Transistor 604 is the current sensing transistor and transistor 200 is the power switching transistor. A secondary path is added in parallel with the power switching transistor 200 in order to be used as a reference for the sensing transistor 604. This secondary path is accomplished by connecting two substantially identical transistors 601 and 602 in series. Thus each of the transistors 601 and 602 of the secondary path see half the voltage across the power switching transistor 200. In order to simplify understanding of the principle, each of transistors 601, 602 and 604 are identical and have a W/L ratio of 1/A versus the pass transistor 200. Consequently the current flowing in each of transistors 601, 602 and 604 is equal to Iswitch/2A. This shouldn't solve the problem unless these two series transistors 601 and 602 have a separated gate control. In order ensuring the correct Vsw/2 value during the "on" state of the power switching transistor 200, both of these two series transistors 601 and 602 have their gates tied to the same voltage as the power switching transistor 200. But when the power switching transistor 200 is "off" only transistor 601 has its gate voltage tied to the power switching transistor 200 gate voltage while transistor 602 has its gate voltage tied to a value that maintains it in an "on" condition. Therefore the voltage across transistor 602 falls to zero since transistor 601 is "off." Consequently the voltage across transistor 601 ranges from about 0 to Vsw/2. Therefore the voltage swing that the current conveyor has to follow is only 0 to Vsw/2. It is contemplated and within the scope of this disclosure that the 1/2 ratio described herein may be any fractional number between 0 and 1 as well as the relative sizing of transistors 601, 602 and 604.

BRIEF DESCRIPTION OF THE DRAWINGS

A more complete understanding of the present disclosure thereof may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

In a general sense, a power converter can be defined as a device which converts one form of energy into another on a continuous basis. Any storage or loss of energy within such a power system while it is performing its conversion function is usually identical to the process of energy translation. There are many types of devices which can provide such a function with varying degrees of cost, reliability, complexity, and efficiency. The mechanisms for power conversion can take many basic forms, such as those which are mechanical, electrical, or chemical processing in nature. The focus of herein will be on power converters which perform energy translation electrically and in a dynamic fashion, employing a restricted set of components which include inductors, capacitors, inductors, transformers, switches, and resistors. How these circuit components are connected is determined by the desired power translation. Resistors introduce undesirable power loss. Since high efficiency is usually an overriding requirement in most applications, resistive circuit elements should be avoided or minimized in a main power control path. Only on rare occasions and for very specific reasons are power consuming resistances introduced into the main power control path. In auxiliary circuits, such as sequence, monitor, and control electronics of a total system, high value resistors are common place, since their loss contributions are usually insignificant.

Referring to FIG. 1, depicted is a schematic diagram of a high voltage, non-synchronous, high-side drive switching regulator, according to the teachings of this disclosure. A switching regulator, generally represented by the numeral 100, is configured with an integrated circuit device 102 that comprises a power transistor 200, a power transistor driver 106, a level shifter 108, a pulse width modulation (PWM) control circuit 110, and a current sensing circuit 112. Additional components to complete the switching regulator 100 may comprise a schottky diode 118, a boost capacitor 120, an inductor 122, a power diode 124, a filter capacitor 126, a load resistor 128 (may be the actual connected load), and voltage divider resistors 130 and 132.

The boost capacitor 120 is designed to supply an operating voltage, e.g., Vdd, to certain circuit elements operating in the device 102, such as the level shifter and the driver of switch 200. The voltage divider resistors 130 and 132 supply a scaled down representation of the output voltage to node 156 connected to the PWM control circuit 110. The current sensing circuit 112 supplies an input current 154, $I_{sense}$, to the PWM control circuit 110. The PWM control circuit 110 uses the input current 154, $I_{sense}$, and output voltage 156 feedback signals to effectively control the charge being transferred from the unregulated supply voltage from a voltage source, e.g., battery 114, to generate the regulated output voltage.

By accurately sensing the input current 154, $I_{sense}$, without introducing significant measurement delay, good load regulation is achieved. Low sensing delay ensures a fixed duty cycle PWM control over a wide range of output currents and high input-to-output voltage ratios.

Figure 4:
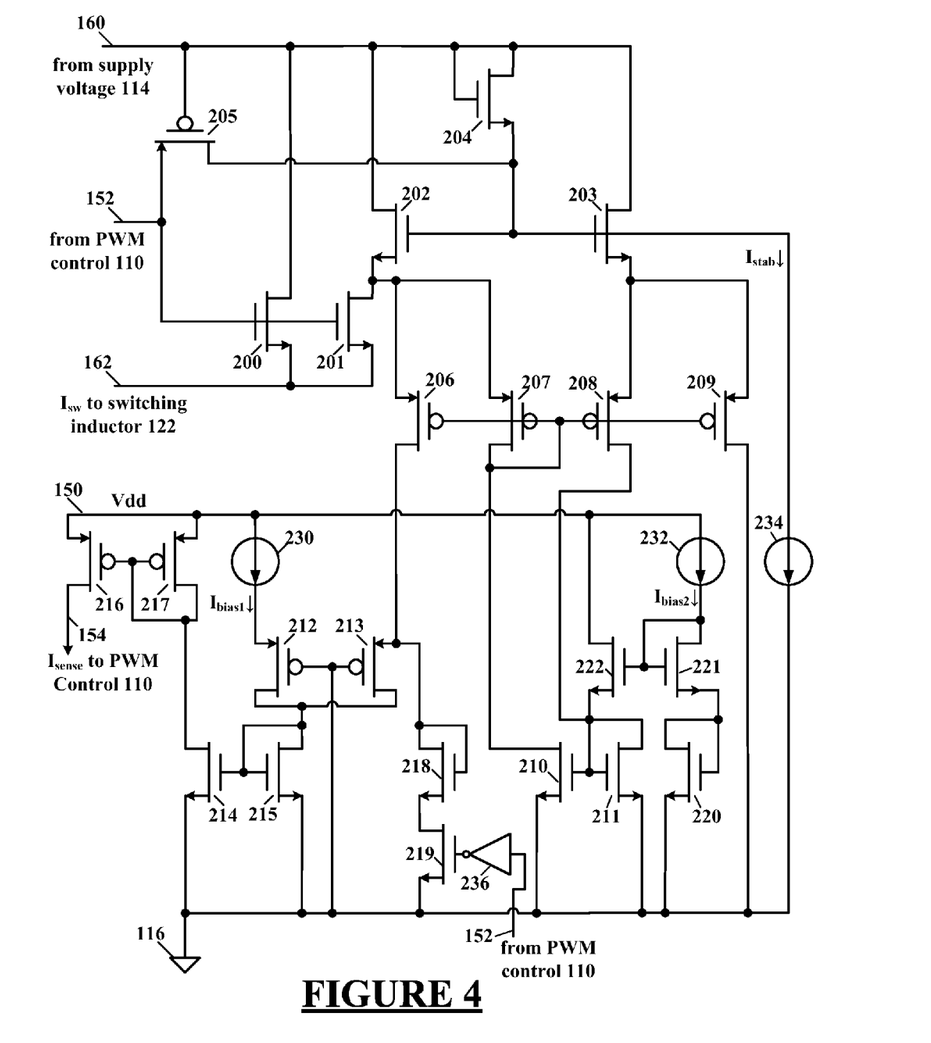
FIG. 4 illustrates a more detailed schematic diagram of a portion of the integrated circuit device of FIG. 1, according to a specific example embodiment of this disclosure.

Referring to FIG. 4, depicted is a more detailed schematic diagram of a portion of the integrated circuit device of FIG. 1, according to a specific example embodiment of this disclosure. In the current sensing circuit 112, sensing speed is ensured by keeping most of the sensing circuitry active all of the time, while accuracy is ensured by minimizing the voltage swing at the input of the current conveyor when the power transistor is switching. This is achieved by dividing part of the current sensing circuit 112 into two series connected transistors 201 and 202, wherein transistor 201 has the same connections to its gate and source as does the power transistor 200 so that the first transistor 201 works synchronously with it, and the second transistor 202 has a gate drive design to monitor the voltage swing at the input of the current conveyor circuit comprising transistors 207, 208, 210 and 211.

The core of the current sensing circuit 112 comprises transistors 201, 202, 203, 204, 205, 206, 207, 208, 210 and 211. Transistor 209 is added for balancing purposes as more fully described hereinbelow. Transistors 201, 202 and 203 are of the same type as the power transistor 200, but only a fraction in size of the power transistor 200. The rest of the transistors 201 to 211 are sized to have the correct operating conditions over the entire sensed current range that needs to be delivered, depending upon the input to output voltage range and output currents thereof.

Operation of the circuits shown in FIGS. 1 and 4 work as follows: when the drive voltage at node 152 goes HIGH (H) with respect to the switched voltage at node 162, transistors 200 and 201 turn ON. When the drive voltage at node 152 increases above the input voltage at node 160 by a threshold voltage, transistor 205 (PMOS) turns ON and connects the gates of transistors 202 and 203 to the drive voltage at node 152. Hence, transistors 200, 201, 202 and 203 have their gates connected to the same potential.

Transistors 202 and 203 preferably are larger than transistor 201 by a factor of at least two (2). For example, but without limitation thereto, pick a ratio of three (3). This means that the resistance between the drain and source of transistor 202 is approximately equal to one-third (⅓) of the resistance between the drain and source of transistor 201. Thus the current through transistor 202 ($I_{202}$) is three times as large as the current through transistor 201 ($I_{201}$). Therefore, a current twice as large as $I_{201}$ will be delivered to the input of the current conveyor (transistors 206 and 207). Transistors 206 and 207 are identical, thus twice the current $I_{201}$ is equally shared between transistors 206 and 207. Finally, the current flowing into transistors 206 ($I_{206}$) and 207 ($I_{207}$) is equal to the current flowing into transistor 201 ($I_{206}=I_{207}=I_{201}$). The current flowing into transistor 203 ($I_{203}$) is shared between transistors 208 ($I_{208}$) and 209 ($I_{209}$). Transistor 208 is substantially identical to transistor 207, and transistor 209 is substantially twice the size of transistor 208. Therefore it drives twice the current flowing into transistor 208 ($I_{209}=2*I_{208}$). Finally, when the current in transistor 208 ($I_{208}$) is substantially equal to the current flowing into transistor 207 ($I_{207}$), the current flowing into transistor 209 ($I_{209}$) balances the sum of currents flowing into transistors 201 and 206 ($I_{209}=I_{201}+I_{206}$). The current through transistor 207 ($I_{207}$) is replicated by transistor 208 and the current in the current conveyor (transistors 206 and 207) starts to follow the current $I_{200}$ through the power transistor 200, setting the gate to source voltages of transistors 202 and 203 to be substantially identical.

The value of the current delivered to the control circuitry via signal 154, $I_{sense}$, may be deduced as follows:

$I_{201}=(1/2)*(W_{201}/W_{200})*I_{200}$ transistor 202=$n$*transistor 201 => $I_{202}=n*I_{201}$ transistor 206=transistor 207 => $I_{206}=I_{207}=(1/2)*(n-1)*I_{201}$ For n=3, $I_{206}=I_{207}=I_{201}$. Therefore, in this case the current delivered to the control circuitry, $I_{206}$, is:

$I_{206}=I_{207}=I_{201}=(1/2)*(W_{201}/W_{200})*I_{200}$

The accuracy of the current conveyor is directly related to the matching of transistors 202 and 203. For good matching, transistors 202 and 203 should be of equal size or close to equal in size. Because of that, when $I_{200}$ is large, resulting in large values of current in the current conveyor, having a larger current drained from transistor 202 ($I_{202}$) with respect to transistor 203 ($I_{203}$) results in having an offset in the current conveyor because transistors 202 and 203 no longer operate under identical conditions.

To eliminate such a condition, a current equal to the difference between $I_{202}$ and $I_{203}$ is bypassed to ground (through transistor 209) so as to balance the current conveyor (transistors 206 and 207) and the transistors 202 and 203 biasing conditions. In the case when the size of the circuit is critical, current sensing circuit size can be reduced by using the current through transistor 209 ($I_{209}$) as the current that is delivered to the low side, thus eliminating the need for transistor 206. The price to pay in such a case is a slight increase of the noise, at the beginning of sensing, because the sources of transistors 208 and 209 need a minimum time before settling at the same level with the sources of transistor 206 and 207. In the case where the minimum duty cycle is sufficiently high, this additional noise will not have a significant effect on the overall performance.

Switching power supply buck converters may work either in the continuous current conduction mode when the inductor current is always larger than zero, or in the discontinuous current conduction mode when the current decreases to zero within the switching cycle.

The discontinuous current conduction mode corresponds to narrow duty cycles, and is a result of a high input to output voltage ratio and low output current demand. In such a case, because the sensing takes place for only a fraction of the cycle, especially for the low frequency buck converters, the current in the current conveyor can decrease to zero by the time the next cycle starts. Zero current in the current conveyor translates into increased sensing delay, because startup time of the current conveyor adds delays that can be even larger than the duty cycle required by the input/output regulator transfer function. Having sensing delays in this particular case (narrow duty cycle) results in a variable duty cycle that makes the output filtering of the switching regulator more difficult.

To eliminate this zero current condition, during the OFF time of the cycle, a current is dynamically injected into the current conveyor when the current decreases below a minimum level. Dynamic biasing is done by transistors 220, 221 and 222, and works as follows: when the current in the current conveyor decreases, the gate to source voltage of transistor 211 decreases. As a result, the gate to source voltage of transistor 222 increases and the transistor 222 turns ON. The transistor 222 current ($I_{222}$) goes through transistor 211 ($I_{211}$), and is replicated by transistor 210 ($I_{210}$) so that a minimum current is maintained in the current conveyor (transistors 206 and 207).

A second condition exists in the discontinuous current conduction mode that can degrade sensing accuracy. When the inductor current decreases to zero, the switched voltage potential at node 162 starts to vary within large limits. This variation is coupled to the gates of transistors 202 and 203, and because the amplitude and frequency of the voltage oscillation at node 162 is not constant from cycle to cycle, different offset values can be added to the sensed current from one cycle to another, resulting in variable duty cycle even in the case of fixed input/output voltage ratio and fixed output current. To eliminate the offset, a diode connected NMOS transistor 204 may be used. By passing a constant current, $I_{stab}$, through transistor 204 (through constant current sink 234) the gate to source voltage of transistor 204 remains constant. In this way, the gate to source voltage of transistors 202 and 203 is the same at the beginning of each cycle. During the on time, transistor 204 is blocked (cutoff).

Switching noise is one factor that affects the degree of output voltage regulation. With the increase of the input voltage at node 160, even though the voltage swing at the point where the current is collected by the current conveyor is very low, some noise still exits, and this noise gets injected in the sensing circuit. The noise can become critical when the input/output voltage ratio is very high, because the duty cycle of the PWM control signal needs to be very low. To make things worse, in the non-synchronous buck regulators, the parasitic capacitance and the speed of the rectifying diode 124 results in a high current spike at the beginning of the sensing time interval. If in the case of the current conveyor itself, the noise is immediately eliminated, what goes through transistor 206 ($I_{206}$) directly impacts the control circuitry, e.g., pulse width modulation (PWM) control circuit 110.

According to the teachings of this disclosure, the current sensing solution limits the noise by two mechanisms: 1) part of the switching noise is bypassed to ground at the beginning of the switching cycle by means of transistor 219 being ON during the OFF time of the cycle (from inverter 236), and 2) current replication transistors 214, 215, 216 and 217 are used to smooth the current coming from the current conveyor to the PWM control circuit 110. To maintain high speed, transistor 215 is biased even when current coming from the current conveyor is bypassed to ground when transistors 218 and 219 are in conduction by means of a current source, $I_{bias}(I_{bias1}+I_{bias2})$ (e.g., constant current sinks 230 and 232).

Transistor 213 is used to isolate transistor 215 when the current through transistor 206, $I_{206}$, is drained (e.g., bypassed) to ground by transistors 218 and 219, and transistor 212 is used for circuit symmetry.

Figure 5:
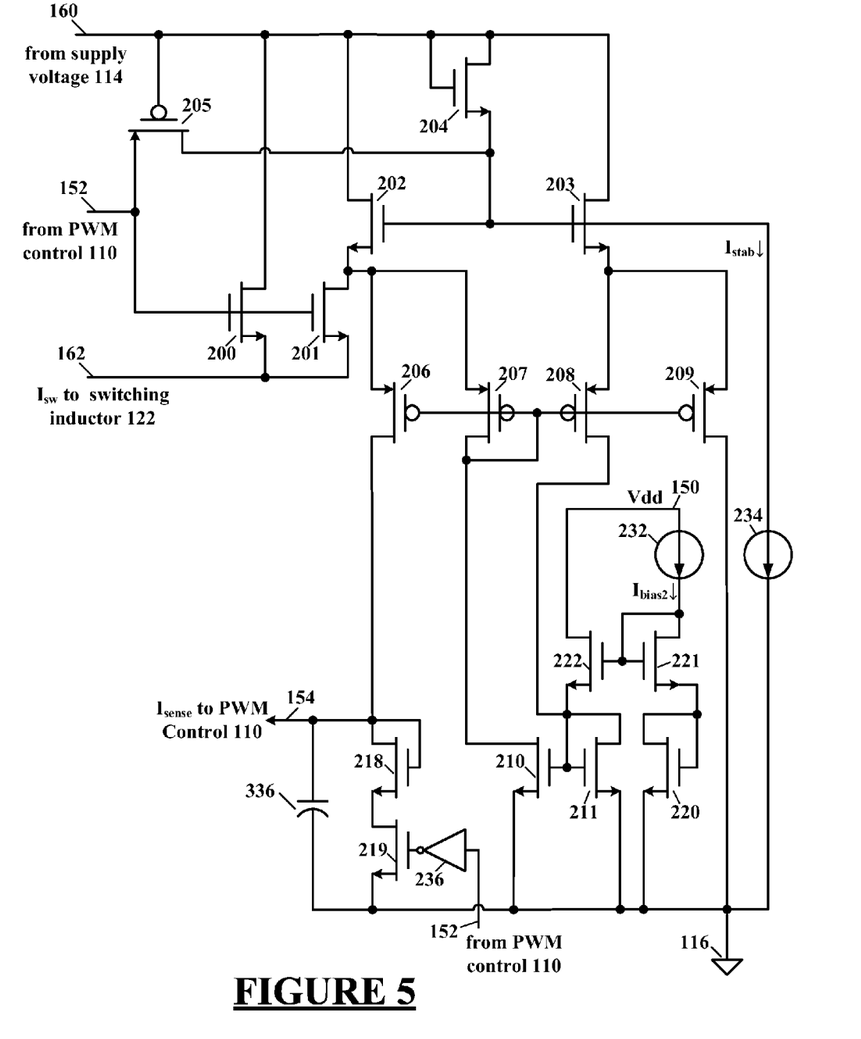
FIG. 5 illustrates a more detailed schematic diagram of a portion of the integrated circuit device of FIG. 1, according to another specific example embodiment of this disclosure.

Referring to FIG. 5, depicted is a more detailed schematic diagram of a portion of the integrated circuit device of FIG. 1, according to another specific example embodiment of this disclosure. The circuit of FIG. 5 operates in substantially the same way as the circuit shown in FIG. 4, but filtering provided by transistors 212, 213, 214, 215, 216 and 217; and current source 230 (FIG. 4) are no longer necessary when used for low input voltage devices. The simplified circuit of FIG. 5 results in less current consumption and less area required for the current sensing circuit of the integrated circuit device 100. However, in the case of very high duty cycle, the possibilities of residual voltage buildup on the capacitor 336 needs to be taken into account. Also, for low input/output voltage ratios, additional filtering is not necessary as the duty cycle is sufficiently high such that the limited noise that is injected into the sensing circuit represents a very small fraction of the entire sensed current. In the high voltage regulators that usually deliver a wide range of output voltages and currents, having the minimum filtering, though not required, helps to increase the accuracy for all output voltages and current ranges.

Figure 6:
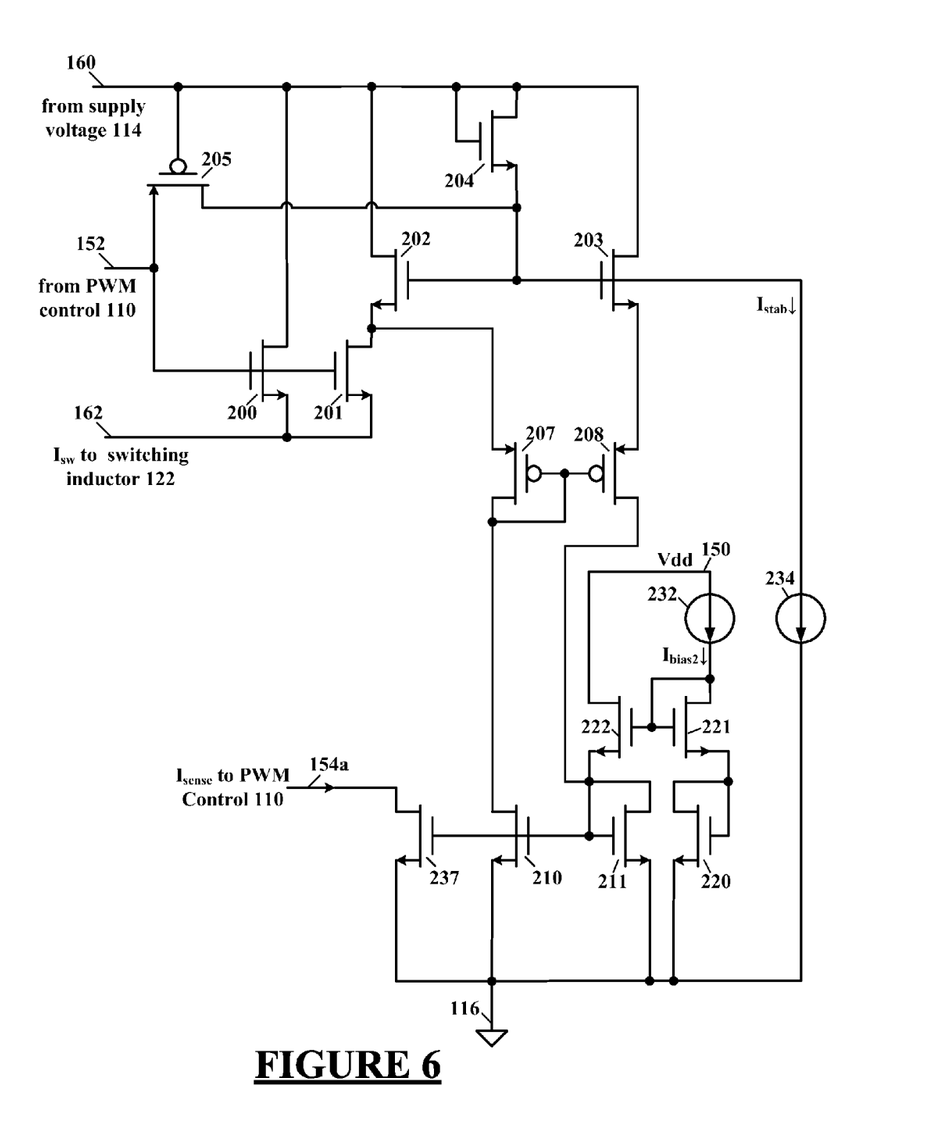
FIG. 6 illustrates a more detailed schematic diagram of a portion of the integrated circuit device of FIG. 1, according to still another specific example embodiment of this disclosure.

Referring to FIG. 6, depicted is a more detailed schematic diagram of a portion of the integrated circuit device of FIG. 1, according to still another specific example embodiment of this disclosure. Another way in which current sensing may be implemented is shown in FIG. 6. By connecting the gate of transistor 237 to the gate of transistor 211, the current through it, $I_{237}$, will be a replication of the current passing through the conveyor (transistors 207, 208, 210 and 211) and a fraction of $I_{200}$. In this configuration, transistors 206 and 209 are no longer needed if the ratio between transistors 201, 202 and 203 is such that the transistors 202 and 203 always have identical operating conditions.

The sensed input current 154a (current through transistor 237, $I_{237}$) will have a reversed polarity compared to the sensed input current 154, $I_{sense}$, shown in FIGS. 4 and 5. Some circuit architectures work with sensed current having this polarity, in which case the current sensing circuit may be implemented with the lowest possible size on the integrated circuit die (not shown). However, in this case, no additional filtering exists; the noise is slightly higher and limits the minimum possible duty cycle. Additional filtering can be performed in this case too, by using filtering current replicate networks that eliminate the high frequency components, as described more fully hereinabove.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An integrated circuit device having input current and output voltage sensing for control of a voltage switching regulator, said integrated circuit device comprising:
   a power switching transistor having a drain coupled to a voltage source, a source coupled to an inductor of the voltage switching regulator, and a gate for controlling the power switching transistor;
   a driver circuit having an output coupled to the gate of the power switching transistor;
   a voltage level shifter circuit coupled to an input of the driver circuit;
   a current sense circuit for providing a sense current representative of a load current through the power switching transistor; and
   a switching regulator control circuit having an output coupled to the voltage level shifter circuit, a first input for receiving a voltage feedback signal representative of a voltage output of the voltage switching regulator, and a second input for receiving the sense current from the current sense circuit;
   the current sense circuit comprises:
   first and second transistors coupled in series parallel to the power switching transistor,
   a sensing transistor coupled with said voltage source; and
   a regulating circuit coupled with a node between said first and second transistor and with said sensing transistor;
   wherein the gate of the first transistor is coupled with the gate of the power switching transistor and the gates of the second transistor and the sensing transistor are connected,
   wherein the sensing transistor and the second transistor are controlled in a first mode to receive a control signal from said driver circuit and in a second mode to be biased to be switched on, wherein the first mode is a power switching transistor on mode and the second mode is a power switching transistor off mode.

2. The integrated circuit device according to claim 1, wherein the switching regulator control circuit comprises a pulse width modulation (PWM) switching regulator control circuit.

3. The integrated circuit device according to claim 1, wherein the sensing transistor and the second transistor are switched on when the power switching transistor is turned off.

4. The integrated circuit device according to claim 3, further comprising a third transistor whose switching path is coupled between the gate of the power switching transistor and the gates of the sensing transistor and said second transistor and whose gate is coupled with said voltage source.

5. The integrated circuit device according to claim 4, wherein first and second transistors are substantially identical transistors, whereby each of the first and second transistors has one-half the voltage across the power switching transistor.

6. The integrated circuit device according to claim 5, wherein the series connected first and second transistors are sized in such a way that a voltage across the first transistor is a fraction x (0<x<1) of the voltage across the power switching transistor and the voltage across the second transistor is the fraction (1−x) of the voltage across the power switching transistor.

7. The integrated circuit device according to claim 1, wherein the resistance between the drain and source of the second transistor is approximately equal to one-third (⅓) of the resistance between the drain and source of the first transistor.

8. The integrated circuit device according to claim 1, further comprising a diode connected transistor coupled between the gates of the sensing transistor and said voltage source.

9. An integrated circuit device having input current and output voltage sensing for control of a voltage switching regulator, said integrated circuit device comprising:
   a power switching transistor having a drain coupled to a voltage source, a source coupled to an inductor of the voltage switching regulator, and a gate for controlling the power switching transistor, wherein the gate receives a pulse width modulation (PWM) control signal;
   first and second transistors connected in series, wherein the series connected first and second transistors are connected in parallel with the source and drain of the power switching transistor, and a first input of a current control circuit is coupled to a drain of the first transistor and a source of the second transistor; and
   a sensing transistor having a drain and a gate connected to a drain and a gate, respectively, of the second transistor, and a source connected to a second input of the current control circuit; and
   a switch which is controlled to feed the pulse width modulation (PWM) control signal to the gate of the sensing transistor and to a gate of the second transistor when the power switching transistor is on and a standby voltage value when the power switching transistor is off, wherein a voltage at the gates of the second and sensing transistors does not exceed one-half (½) of the sourced voltage.

10. A method for reducing current sensing delay when measuring current to a voltage switching regulator and generating corresponding sense current values for control of the voltage switching regulator, said method comprising the steps of:
   providing first and second transistors coupled in series, wherein the first and second transistors are coupled in parallel with a power switching transistor which is coupled with a power source, and a sensing transistor coupled with said power source;
   regulating a sensing current by a regulating circuit coupled with a node between said first and second transistors and said sensing transistor;
   wherein the first transistor is controlled by a control signal provided for the power switching transistor;
   wherein the sensing transistor and the second transistor are controlled in a first mode to receive the control signal for said power switching transistor and in a second mode to be biased to be switched on wherein the first mode is a power switching transistor on mode and the second mode is a power switching transistor off mode.

11. The method according to claim 10, wherein the control signal is provided by a pulse width modulation (PWM) switching regulator control circuit.

12. The method according to claim 10, wherein the sensing transistor and the second transistor are switched on when the power switching transistor is turned off.

13. The method according to claim 10, wherein control gates of said sensing transistor and said second transistor are coupled with the gate of said power switching transistor if said control voltage is higher than a voltage of said power supply.

14. The method according to claim 13, further comprising biasing said gates of said sensing transistor and said second transistor by means of a diode connected transistor coupled between said power supply and said gates.

15. The integrated circuit device according to claim 1, wherein the regulating circuit comprises means to bypass part of the switching noise to ground at the beginning of a switching cycle by means of a fourth transistor being switched on during an off time of the power switching transistor.

16. The integrated circuit device according to claim 1, wherein the regulating circuit comprises current replication transistors to smooth the sensing current.

17. The integrated circuit device according to claim 9, wherein the switch is formed by a field effect transistor having a drain source path connecting the gates of the sensing transistor and the second transistor with the gates of the power switching transistor and the first transistor.

* * * * *